(12) United States Patent
Chan

(10) Patent No.: US 6,678,848 B1
(45) Date of Patent: Jan. 13, 2004

(54) PROGRAMMING CIRCUITRY FOR CONFIGURABLE FPGA I/O

(75) Inventor: King W. Chan, Los Altos, CA (US)

(73) Assignee: Actel Corporation, Sunnyvale, CA (US)

( * ) Notice: Subject to any disclaimer, the term of this patent is extended or adjusted under 35 U.S.C. 154(b) by 485 days.

(21) Appl. No.: 09/748,745

(22) Filed: Dec. 21, 2000

(51) Int. Cl.$^7$ .......................................... G01R 31/3181
(52) U.S. Cl. ........................................ 714/727; 326/38
(58) Field of Search ..................... 326/37–50; 716/16; 714/727

(56) References Cited

U.S. PATENT DOCUMENTS

| | | | |
|---|---|---|---|
| 4,758,745 A | 7/1988 | Elgamal et al. ............. | 307/465 |
| 4,823,181 A | 4/1989 | Mohsen et al. .............. | 357/51 |
| 5,991,908 A | * 11/1999 | Baxter et al. ............... | 714/727 |
| 6,242,943 B1 | * 6/2001 | El-Ayat ....................... | 326/38 |
| 6,392,437 B2 | * 5/2002 | El-Ayat ....................... | 326/38 |
| 2003/0020512 A1 | * 1/2003 | Mantey et al. ............... | 326/38 |

OTHER PUBLICATIONS

Luis Morales, The Programmable Logic Data Book, available from Xilinx, Inc., 2100 Logic Drive, San Jose, California 95124, published 1994, pp. 8–45 to 8–50.*
Using JTAG Boundary–Scan with ProASIC™ 500K Devices, available from Actel Corporation, 955 East Arques Avenue, Sunnyvale, California 94086, published Nov. 2000, pp. 1–10.*

* cited by examiner

Primary Examiner—R. Stephen Dildine
(74) Attorney, Agent, or Firm—Sierra Patent Group, Ltd.

(57) ABSTRACT

In a one-time programmable FPGA, new circuitry interfaces between boundary scan registers and configurable I/O cells is disclosed incorporating the use of boundary scan registers for both addressing, and establishing the value of, individual programmable elements used to configure configurable I/O.

12 Claims, 4 Drawing Sheets

PROGRAMMING CIRCUITRY FOR CONFIGURABLE FPGA I/O

BACKGROUND OF THE INVENTION

1. Field of the Invention

The present invention relates to FPGA technology. More specifically, the present invention relates to programming the configuration of FPGA I/O.

2. The Prior Art

FPGA devices are known in the art. FPGA devices have I/O blocks or cells, logic blocks, and connecting circuitry. Each of these three elements are design elements and may be configured, to various extents, by users. The FPGA I/O cells are configurable, having a selection of I/O features such as LVTTL, 3.3V PCI, 5V PCI, 5V CMOS, GTL, HSTL, etc.

Fuse devices are well known in the art, being used for devices having a relatively small number of gate equivalents. Antifuse devices are a newer technology being used for one-time programmable devices, and have become the implementation choice for devices needing a relatively large number of gate equivalents. Antifuse devices comprise a pair of conductive electrodes separated by at least one layer of antifuse material and may include one or more diffusion barrier layers. Prior to programming, antifuses exhibit very high resistance between the two electrodes and may be considered to be open circuits. A programming process disrupts the antifuse material and creates a low-impedance connection between the two conductive electrodes.

One-time programmable FPGAs may be implemented using any programmable (configurable) media, such as fuse or antifuse substrates. The predominant base technology today is antifuse.

One-time programmable FPGAs also require that I/O be configurable. Current FPGA devices have circuitry dedicated to this I/O configuration task, which necessitates a design and implementation effort solely for that purpose. This adds all the associated monetary costs as well. In addition to the monetary costs, the I/O configuration circuitry uses very valuable real estate (physical layout space) where such space is at a premium. As a final drawback, much, of the I/O configuration circuitry used to permanently set I/O options and configurations for a particular application is not used again. Although the functionality provided by the I/O configuration circuitry is required, much of the circuitry used to provide that functionality in current designs is used very little after initial configuration. Those portions of the circuit not used after configuration therefore waste space and cost.

The inherent costs, layout space usage, and unused circuitry after configuration in current I/O configuration circuitry designs have left an unfilled need to reduce the costs with respect to any of the three aspects. A reduction in any one of the three would result in significant savings and increased reliability over the build quantities found in typical FPGA chips; a reduction in all three areas would be a significant step forward in the area of I/O configuration circuit design.

It is therefore a goal of this invention to provide a method and system for reducing the inherent costs, layout space usage, and the amount of circuitry that remains unused after I/O configuration has taken place in FPGAs.

BRIEF DESCRIPTION OF THE INVENTION

The present invention uses boundary scan registers, a set of components on FPGAs needed to test the FPGAs connectivity once installed on a board, to both address and program a set of individually programmable elements that are then used to determine I/O configurations. The boundary scan registers may be used to do this because they are not normally used for testing until after the FPGA has been programmed—there will be no interference between the two functional uses of the registers. A way has been found to use the boundary scan registers to program configurable I/O, and then, after the I/O is configured, to use the boundary scan registers as they were originally intended: for testing purposes once the FPGA is installed on a board.

According to another aspect of the present invention, the boundary scan registers can also be used to test the FPGA connectivity before programming by simulating the programming and testing the FPGA.

The circuitry needed to use the boundary scan registers in this new and unusual way is substantially less than that used in the prior art to program configurable I/O. There are, overall, fewer registers and fewer individual design elements, which all together use less space on the chip than previous designs. This means that not just one, but all three improvements over the prior art have been reached: the present invention provides a method and system for reducing the inherent costs, layout space usage, and the amount of circuitry that remains unused after I/O configuration has taken place in FPGAs.

The present invention discloses circuitry that interfaces with boundary scan registers, using the contents of the boundary scan registers to first address individually programmable elements and then to program those same elements. The individually programmed elements are configured to permanently enable or disable (as requirements dictate) configurable I/O features. Finally, there is provided a new individual program element test circuit, which will read 0 if the individual element has not been programmed, or a 1 if it has been programmed (regardless of the value of the programming). This allows the individual programmable elements of each I/O cells to be checked to see if they have been programmed or not, providing a way to establish the status or success/failure of previous programming.

DETAILED DESCRIPTION OF THE INVENTION

Those of ordinary skill in the art will realize that the following description of the present invention is illustrative only and not in any way limiting. Having the benefit of the present disclosure, other embodiments of the invention will readily suggest themselves to such skilled persons.

Figure 1:
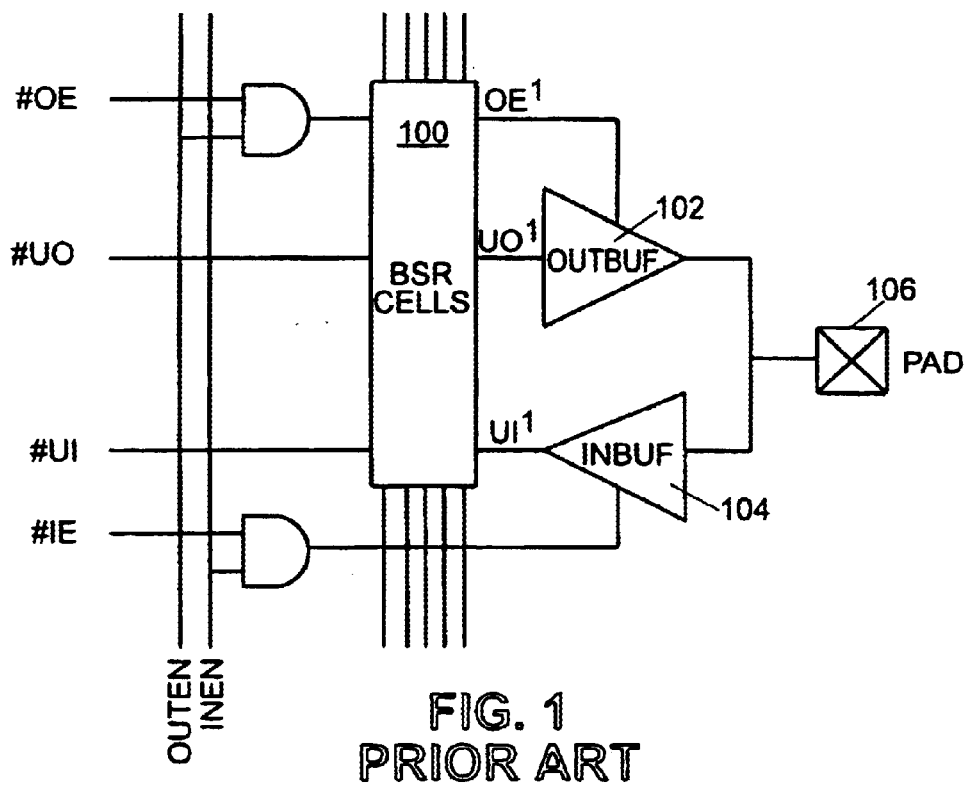
FIG. 1 is a block diagram of a prior art boundary scan register.

Referring to FIG. 1, a boundary scan register as is known in the art is illustrated. It has a set of boundary scan register cells 100 which transmit and receive bits from outside the chip on which the boundary scan register is implemented.

Figure 2:
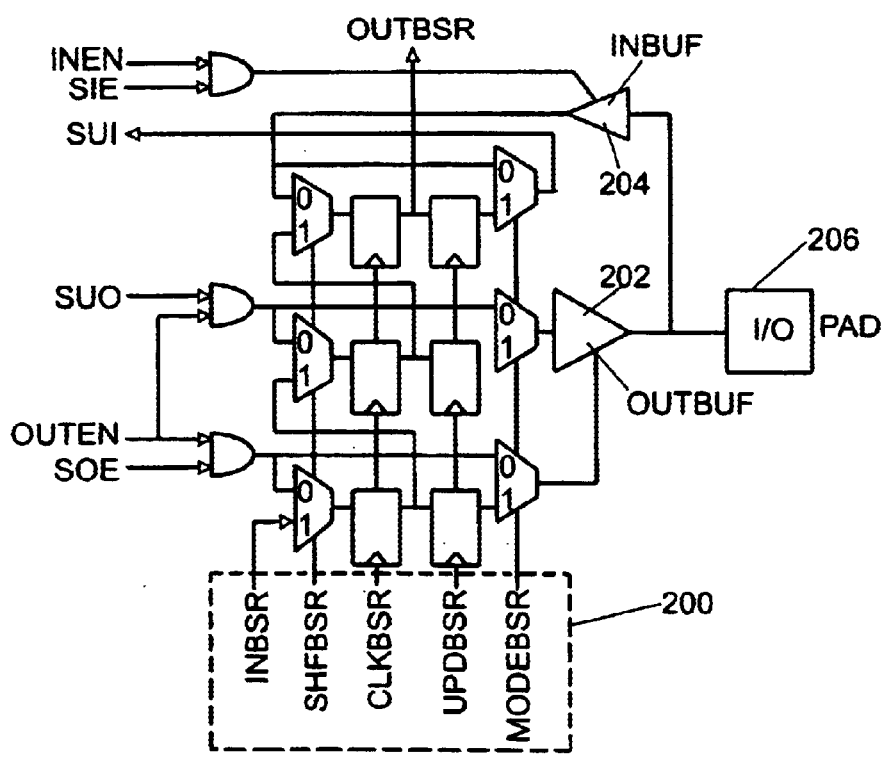
FIG. 2 is a detailed diagram of a prior art boundary scan register in an I/O cell.

The boundary scan register 100 is connected to the rest of the FPGA through an I/O cell connected to pad 106, using input buffer 102 or output buffer 104 as needed. FIG. 2 shows more internal details of the same circuitry shown in FIG. 1, with input buffer 204, output buffer 202, and I/O pad 206. The boundary scan register bus lines are labeled individually at block 200.

Figure 3:
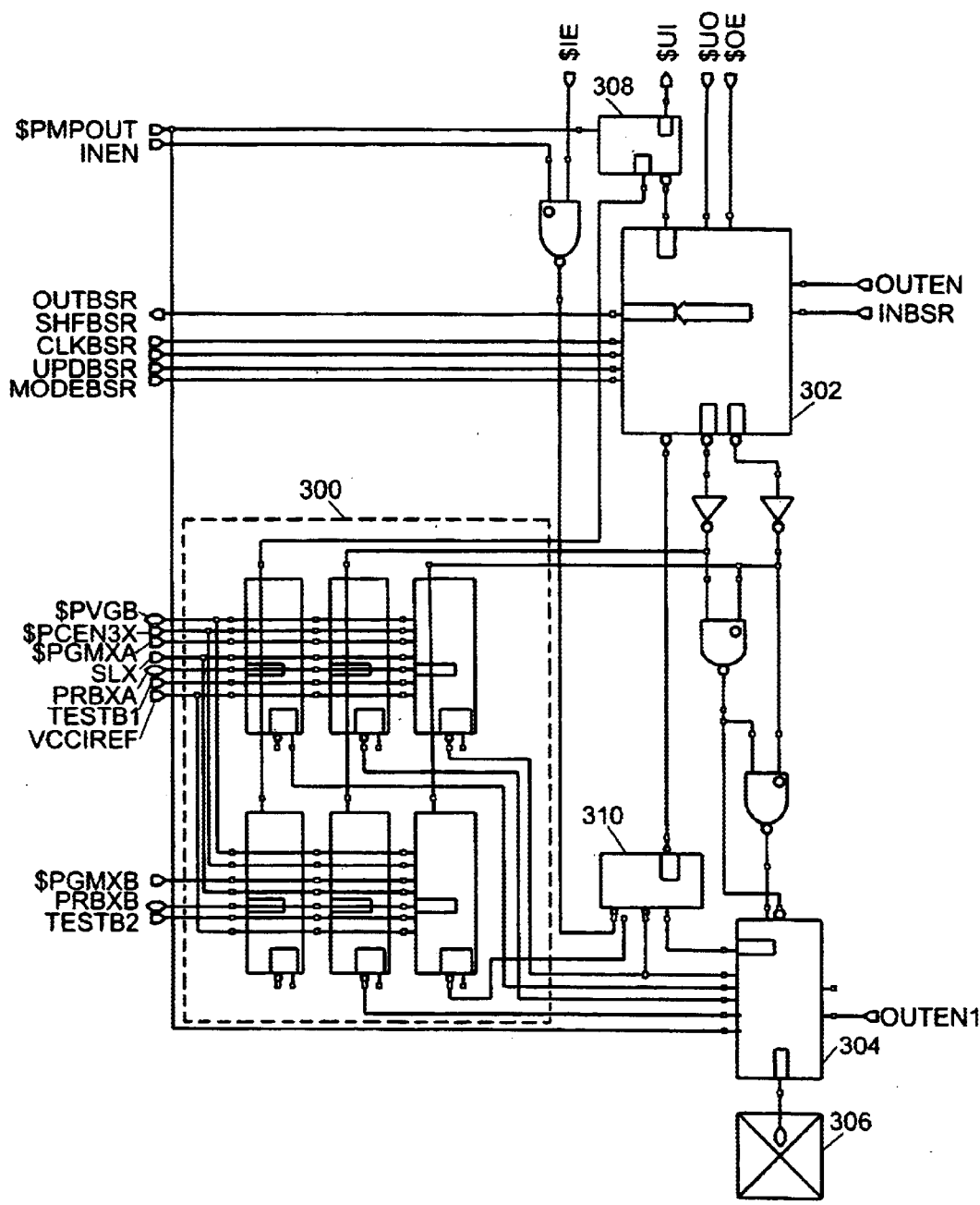
FIG. 3 is a diagram showing a boundary scan register in an I/O cell according to the present invention.

FIG. 3 is a circuit diagram showing one possible implementation of the present invention. The figure includes the boundary scan registers shown in FIGS. 1 and 2, together with the new I/O configuration circuitry. Boundary scan register cells 302, input buffer 308 and 310, output buffer 304, and I/O connection pad 306 are able to perform the same functions as the components with the same names shown in FIGS. 1 and 2. However, in addition to the normal functions associated with boundary scan register logic, FIG. 3 includes I/O configuration logic, primarily located inside circuit 300. In the implementation shown in I/O configuration circuit 300, anti-fuses are aligned into two banks of three individually programmable units each, for a total of 6 individually programmable units. Each unit may be set to be on or off, and is logically equivalent to permanently setting individual I/O configuration bits to 1 or 0. I/O configuration circuit 300 is connected to boundary scan register cells (the boundary scan register) 302 such that the contents of boundary scan register 302 may be used to program I/O configuration circuit 300. This will be a one-time only operation, and will typically be carried out before the chip is inserted into a board. Once the I/O configuration circuit 300 has been configured, meaning the individual programmable elements in I/O configuration circuit have been set to 1 or 0 (closed or open), I/O configuration circuit 300 is set to permanently enable or disable (as the case may be) I/O configuration options for a particular application. As describe below, the programmable elements in the I/O configuration circuit may also be tested prior to programming to determine if the expected features is properly enabled.

Figure 4:
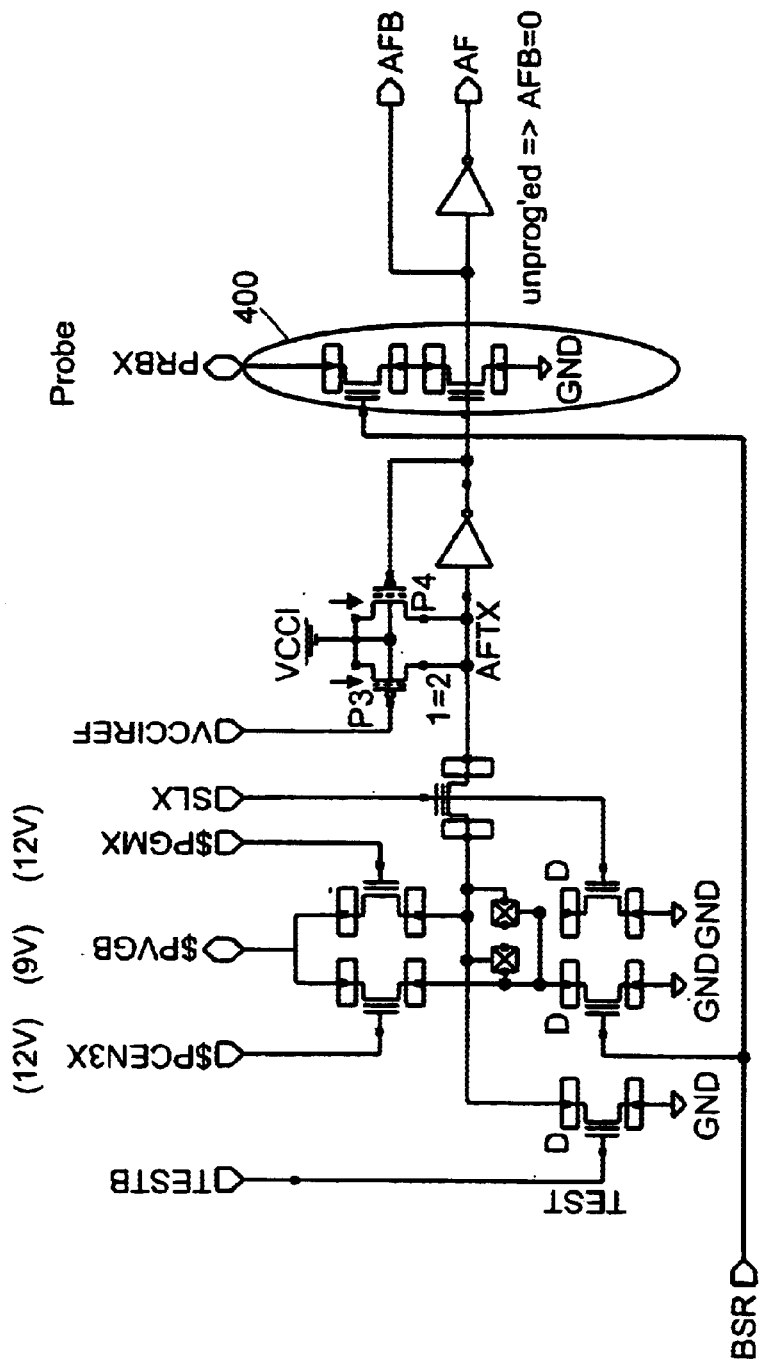
FIG. 4 is a diagram showing one implementation of a single bit programmable element according to the present invention.

FIG. 4 shows an implementation of a single programmable element, one of the six shown in I/O configuration circuit 300 in FIG. 3. In addition to showing a preferred implementation using antifuses, also shown is a new circuit component that allows the current programmed state of the single programmable element to be read out, programmed indicator circuit 400. Programmed indicator circuit 400 sets AFB to 0 if this programmable element has not been programmed, otherwise it is set to 1. This allows testing of each programmable element to see if it has been programmed, including the ability to detect if an attempt to program an I/O configuration succeeded or failed.

The implementation of FIG. 4 can also be used to test for expected features prior to programming. In this way, TESTB signal can be set to simulate that the anti-fuse has been set. Then the PRBX can be read to ascertain if the anti-fuse has been programmed as expected.

Figure 5:
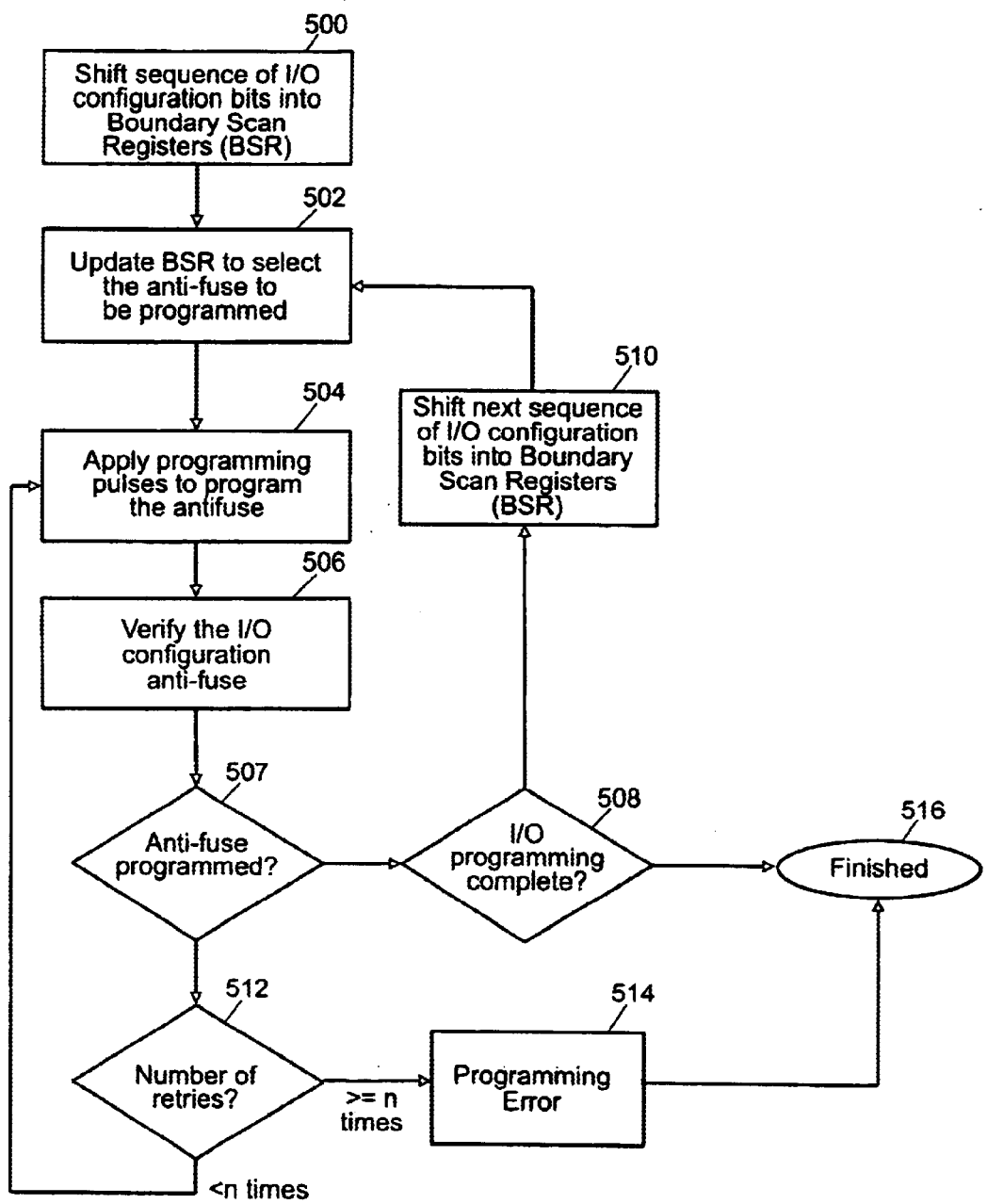
FIG. 5 is a block diagram showing a method of programming configurable I/O using the present invention.

FIG. 5 is a block diagram showing a method for programming configurable I/O using boundary scan registers according to the present invention. The FPGA will typically be programmed before insertion into a board, with the chip in a test fixture of some type. There will be pin connections and a programmable interface to allow vectors to be sent to the chip. After the FPGA is in such a fixture, the first act, shown in block 500, is to shift a vector (a sequence of 0s and 1s) into the boundary scan registers. The boundary scan registers are a set of serial registers connected in a serial manner, so they will be shifted in the manner normal for a serial register through a test-in port. The vector will typically have been programmed by a person familiar with the FPGA and having knowledge of the desired I/O configuration, although the programming could be automated. Which is used will depend on the sophistication of the tester holding the FPGA test fixture. However it is designed, the correct vector must be entered so that the desired bank of individual programmable elements will be enabled when each boundary scan register in each I/O cell (or associated with each I/O cell) is read by I/O configuration circuit.

After shifting the correct vector for the FPGA into the boundary scan registers, block 500 is left and block 502 entered. In block 502 the BSR is updated to select the desired programmable element (antifuse) to be programmed.

The size of a bank of elements will typically be equal to the size of the boundary scan register in each configurable I/O cell. This allows for very easy addressing of each element in the bank. However, as will be readily apparent to one of ordinary skill in this art and with the benefit of the present disclosure, there are any number of ways individual programmable elements could be addressed using the contents of the boundary scan registers. This includes the use of designated fields in sequential loads of the boundary scan registers to address (enable) any number of banks, as well as individually programmable elements. After addressing using any such more complex scheme, there would follow another designated load sequence into the boundary scan registers to program individual programmable elements. All such addressing schemes are contemplated by the current invention and are fully within the inventive nature of the present disclosure.

When discussing boundary scan registers "in" an I/O cell, it is to be understood that some FPGAs actually implement boundary scan registers within I/O cells and some have the circuitry outside, but associated with, individual I/O cells. For the purposes of this disclosure both are functionally equivalent and both are fully within the inventive nature of the present disclosure, and will be described as "in" an I/O cell.

Continuing on in block 502, after the the boundary scan registers have been updated to select the desired bank of individual programmable elements (anti-fuses), block 502 is left and block 504 is entered.

In block 504, the programming of the desired element is implemented by applying the programming pulses to the selected programmable elements (anti-fuses). Processing then continues to block 506.

In block 506, the configuration of the selected programmable element (anti-fuse) is verified, typically by reading the output AFB, as described above. Processing then continues to diamond 507.

At diamond 507, processing continues according to whether programming was successful as determined in block 506. If the programming was successful, processing continues to diamond 508. Otherwise, processing continues to diamond 512.

Diamond 508 establishes if the I/O configuration is now set, that is, if the I/O configuration programming is complete. If it is, diamond 508 is left from the "Yes" branch and the process is finished, which is shown at 516. If there is more programming to be carried out, diamond 508 is left via the "No" branch and block 510 entered.

Block 510 comprises the action of the shifting a new vector into the boundary scan registers, with the new vector designed to enable the next bank of individually programmable elements to be programmed. After the new vector is shifted, block 510 is exited and block 502 is entered. The actions associated with block 502, described in more detail above, is to select the desired programmable elements (anti-fuses).

Diamond 512 is entered when a programming is not successful as determined by diamond 507. In this case, a predetermined number (n) of retries are provided to re-attempt the programming acts for block 504. If the predetermined number of retries has not been exceeded, processing returns to block 504 to reattempt the programming. Otherwise, processing continues to block 514 to indicate a programming error. After the error is reported, processing is competed, block 516.

The sequence consisting of block 502 through block 516 is repeated until the configurable I/O has been programmed as desired.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for setting I/O configurations in a one-time programmable FPGA having boundary scan registers and configurable I/O, comprising:

loading said boundary scan buffers with I/O configuration bits;

providing programmable boundary-scan-to-configurable-I/O circuitry, where said circuitry is operably connected to said boundary scan registers and is operably connected to said configurable I/O;

using said configuration bits in said boundary scan buffers to program said programmable boundary-scan-to-configurable-I/O circuitry in accordance with said configuration bits.

2. The method of claim 1 wherein said configurable I/O further comprises a plurality of I/O cells, and where said boundary scan registers further comprises a plurality of boundary scan register subsets, such that each subset of said plurality of boundary scan register subsets is the same size and each of said plurality of I/O cells contains one of said subsets.

3. The method of claim 2 wherein each of said plurality of I/O cells further comprise at least two banks of individual programmable elements and where each bank of individual programmable elements further comprise at least two individual programmable elements, and where using said configuration bits further comprises:

(a) loading a set of bits into each of said boundary scan register subsets;

(b) using said set of bits loaded into each of said boundary scan register subsets contained in each of said plurality of I/O cells to enable a single bank of individual programmable elements in each of said plurality of I/O cells in accordance with said set of bits;

(c) loading a next set of bits into each of said boundary scan register subsets;

(d) using said next set of bits loaded into each of said boundary scan register subsets to set individual programmable elements in said enabled bank of individual programmable elements in accordance with said next set of bits; and, (e) repeating (a) through (d) until said set of bits loaded into each of said boundary scan register subsets indicates programming has finished.

4. The method of claim 1 wherein said one-time programmable FPGA is a fuse FPGA.

5. The method of claim 1 wherein said one-time programmable FPGA is an antifuse FPGA.

6. The method of claim 1 further comprising:

providing a status circuit for each individually programmable element; and, reading at least one of said status circuits and determining thereby if each individually programmable elements associated with said at least one of said status circuits have been programmed.

7. A one-time programmable FPGA having configurable I/O and boundary scan registers comprising:

programmable boundary-scan-to-configurable-I/O circuitry having a first set of connections and a second set of connections, where said first set of connections is operably connected to said boundary scan registers and said second set of connections is operably connected to said configurable I/O, and where said programmable boundary-scan-to-configurable-I/O circuitry is configured to use vectors input into said boundary scan buffers to configure said configurable I/O in accordance with said vectors.

8. The one-time programmable FPGA of claim 7 wherein said configurable I/O further comprises a plurality of I/O cells, and where said boundary scan registers further comprise a plurality of boundary scan register subsets, such that each subset of said plurality of boundary scan register subsets is the same size and each of said plurality of I/O cells contains one of said subsets.

9. The one-time programmable FPGA of claim 8 wherein each of said plurality of I/O cells further comprise at least two banks of individual programmable elements and where each bank of individual programmable elements further comprise at least two individual programmable elements.

10. The one-time programmable FPGA of claim 7 wherein said one-time programmable FPGA is a fuse FPGA.

11. The one-time programmable FPGA of claim 7 wherein said one-time programmable FPGA is an antifuse FPGA.

12. The one-time programmable FPGA of claim 7 further comprising a plurality of programmed-status circuits, where each of said individual programmable elements has one of said plurality of programmed-status circuits.

\* \* \* \* \*